(12) United States Patent
Ohshima

(10) Patent No.: US 7,061,948 B2
(45) Date of Patent: Jun. 13, 2006

(54) WAVELENGTH STABILIZING APPARATUS AND METHOD OF ADJUSTING THE SAME

(75) Inventor: Shigeru Ohshima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 365 days.

(21) Appl. No.: 10/684,373

(22) Filed: Oct. 15, 2003

(65) Prior Publication Data
US 2004/0131095 A1    Jul. 8, 2004

(30) Foreign Application Priority Data
Oct. 18, 2002    (JP) .............................. 2002-304620

(51) Int. Cl.
*H01S 3/13*    (2006.01)
*H01S 3/10*    (2006.01)
(52) U.S. Cl. .......................................... 372/32; 372/20
(58) Field of Classification Search ............. 372/20, 372/32, 98
See application file for complete search history.

(56) References Cited

U.S. PATENT DOCUMENTS

| | | | |
|---|---|---|---|
| 3,676,799 A * | 7/1972 | Danielmeyer ............... 372/32 |
| 4,097,818 A * | 6/1978 | Manoukian et al. .......... 372/19 |
| 4,152,674 A * | 5/1979 | Taguchi ..................... 372/99 |
| 4,324,475 A * | 4/1982 | Purdie ....................... 356/519 |
| 4,782,492 A * | 11/1988 | McMahon et al. ............ 372/34 |
| 4,998,256 A | 3/1991 | Ohshima et al. |
| 5,432,807 A * | 7/1995 | Okazaki et al. ............. 372/22 |
| 5,920,414 A | 7/1999 | Miyachi et al. |
| 6,094,446 A * | 7/2000 | Tei et al. .................... 372/32 |
| 6,717,965 B1 * | 4/2004 | Hopkins et al. .............. 372/20 |
| 6,805,494 B1 * | 10/2004 | Miki et al. ................... 385/88 |
| 2002/0154428 A1 * | 10/2002 | Nasu et al. .................. 359/892 |
| 2002/0172239 A1 * | 11/2002 | McDonald et al. ........... 372/20 |
| 2003/0016706 A1 * | 1/2003 | Flint et al. ................... 372/20 |
| 2003/0193983 A1 * | 10/2003 | Cheng et al. ................. 372/92 |

FOREIGN PATENT DOCUMENTS

JP    3-72686    3/1991

OTHER PUBLICATIONS

H. Nasu, et al., "2.5 GHz-Spacing Wavelength Monitor Integrated DFB Laser Module Using Standard 14-pin Butterfly Package", OFC 2002, Mar. 20, 2002, pp. 209-211.

J. Saneyoshi, et al., Handbook of Ultra-Sonic Technology, Jul. 20, 1978, pp. 342-345.

(Continued)

*Primary Examiner*—James Menefee
(74) *Attorney, Agent, or Firm*—Oblon, Spivak, McClelland, Maier & Neustadt, P.C.

(57) ABSTRACT

A quartz etalon having light reflecting film layers on the Z-cut surfaces and electrode layers on the X-cut surfaces are axially supported in the X-cut surface electrode layers. A dither signal is applied to this axially supported portion to resonate the etalon. In this state, laser-beam is transmitted through the Z-cut surfaces of the etalon. The transmitted light is photo-electrically converted and subjected to synchronous detection by a dither signal. On the basis of an error signal obtained by the detection output, the oscillation wavelength of the semiconductor laser is controlled. Since the etalon resonates as its axially supported central portion functions as a node, the mechanical loss is small, and the Q value upon mechanical resonance is extremely large. This makes the synchronous detection output about 100 times as large as the conventional value. This increases the signal-to-noise ratio of the photoelectric conversion signal, and increases the wavelength accuracy.

19 Claims, 4 Drawing Sheets

OTHER PUBLICATIONS

M. Miyachi, et al., "A Frequency-Stabilized LD Module With a Z-Cut Quartz Fabry-Perot Resonator for Coherent Communication", Fifth Optoelectronics Conference Technical Digest, Jul. 1994, pp. 390-391.

S. Ohshima, et al., "Analysis of Z-Cut Quartz Etalon for a Wavelength Locker", Proceedings of the 2001 Electronics Society Conference of the IEICE, C-3-47, Sep. 2001, p. 157.
U.S. Appl. No. 11/088,764, filed Mar. 25, 2005, Ooshima.

* cited by examiner

US 7,061,948 B2

WAVELENGTH STABILIZING APPARATUS AND METHOD OF ADJUSTING THE SAME

CROSS-REFERENCE TO RELATED APPLICATIONS

This application is based upon and claims the benefit of priority from the prior Japanese Patent Application No. 2002-304620, filed Oct. 18, 2002, the entire contents of which are incorporated herein by reference.

BACKGROUND OF THE INVENTION

1. Field of the Invention

The present invention relates to a wavelength stabilizing apparatus for stabilizing the wavelength of laser-beam of a semiconductor laser, and a method of adjusting the wavelength to be stabilized.

2. Description of the Related Art

A semiconductor laser is generally used as a light source for wavelength division multiplexing transmission. However, a semiconductor laser has relatively low temperature stability, so the wavelength of radiated light easily shifts due to environmental changes. This wavelength shift interferes with an adjacent wavelength. Therefore, a wavelength division multiplexing transmission system conventionally uses a wavelength stabilizing apparatus for stabilizing the wavelength of the laser-beam of a semiconductor laser.

As an example of this wavelength stabilizing apparatus, Jpn. Pat. Appln. KOKAI Publication No. 3-72686 discloses an apparatus using a quartz etalon resonator. In a wavelength stabilizing apparatus of this type, layers of light reflecting films are formed on the Z-cut surfaces of a quartz etalon, and electrodes are formed on the X-cut surfaces. A dither signal is applied to the electrodes to cause the quartz etalon to vibrate. In this state, laser-beam is transmitted through the quartz etalon. The laser-beam modulated by the cavity length variation of the etalon is received by a photo-detector and converted into an electrical signal. The detected electrical signal is then subjected to synchronous detection by using a dither signal, thereby generating an error signal. On the basis of this error signal, the injection current or temperature of the semiconductor laser is controlled. In this manner, the wavelength of light generated by the semiconductor laser is stabilized at the extremal value of the light transmittance of the quartz etalon.

In the conventional wavelength stabilizing apparatus, the quartz etalon is fixed to a base by an adhesive or the like. Since this increases the mechanical loss, the Q value of the mechanical resonance decreases. This makes it impossible to increase the optical modulation index of the laser-beam transmitted through the etalon. Accordingly, the signal-to-noise ratio of the electrical signal obtained from the photo-detector decreases, and as a consequence the wavelength detection accuracy decreases.

In addition, the frequency of the dither signal to be applied to the quartz etalon must be the same as the mechanical resonance frequency of the etalon itself. This requires precise frequency adjustment. Furthermore, in order that the wavelength characteristic, i.e., the light transmittance of the quartz etalon have an extremal value, the angle (elevation angle) to the optical axis must be adjusted (generally, the elevation angle is 0° at the extremal value).

Unfortunately, even if the angle of the quartz etalon is accurately adjusted, the end face of the quartz etalon is fixed to the base with adhesive after angle adjustment. Therefore, the adjusted angle changes by cure shrinkage of the adhesive or the like, and this produces an error between the wavelength to be stabilized and the extremal value. Also, no dither signal can be applied to the quartz etalon by connecting a line to it unless the adhesive cures. This makes accurate determination of the wavelength difficult. Accordingly, the workability of wavelength setting worsens, and the wavelength setting accuracy significantly decreases.

As described above, the conventional wavelength stabilizing apparatus has the problems that the mechanical loss of the quartz etalon is large, the optical modulation index is difficult to increase, the signal-to-noise ratio of the signal obtained from the photo-detector is low, and the wavelength detection accuracy is low. Also, the frequency of the dither signal to be applied to the quartz etalon must be the same as the mechanical resonance frequency, and this requires frequency adjustment. In addition, although the quartz etalon is fixed by adhesive after angle adjustment is performed to adjust the wavelength characteristic of the quartz etalon, the adjusted angle changes by cure shrinkage of the adhesive or the like. Furthermore, the workability of wavelength setting is low, and the wavelength setting accuracy is also very low.

BRIEF SUMMARY OF THE INVENTION

It is an object of the present invention to provide a wavelength stabilizing apparatus and wavelength stabilizing method capable of significantly increasing the wavelength detection accuracy, eliminating adjustment of a dither signal frequency, improving quartz etalon angle adjustment for adjusting the wavelength stabilizing characteristic, and also improving the workability and wavelength setting accuracy.

According to first aspect of the present invention, there is provided a wavelength stabilizing apparatus for stabilizing the wavelength of a laser-beam radiated from a semiconductor laser, comprising: an etalon which is obtained by cutting a quartz bulk, and includes a pair of light reflecting film layers formed on a pair of Z-cut surfaces of the etalon, respectively, and a pair of electrode layers formed on a pair of X-cut surfaces thereof, respectively; a dither signal generator which generates a dither signal corresponding to a mechanical resonance frequency of the etalon; a pair of shafts which are conductive, have a pair of end portions connected to the pair of X-cut surfaces of the etalon, respectively, to axially support the etalon, and are supplied with the dither signal; a supporting device which supports the pair of shafts; a photo-detector which receives the laser-beam transmitted through the etalon and converts the received laser-beam into an electrical signal; an error signal generator which generates an error signal by comparing the electrical signal with the dither signal; and a controller which controls a driving state of the semiconductor laser on the basis of the error signal, to approach the wavelength of the laser-beam to an extremal value of a light transmittance of the etalon.

According to second aspect of the present invention, there is provided a wavelength stabilizing method of stabilizing a wavelength of a laser-beam radiated from a semiconductor laser, comprising: axially supporting an etalon which is obtained by cutting a quartz bulk, and includes a pair of light reflecting film layers formed on a pair of Z-cut surfaces of the etalon, respectively, and a pair of electrode layers formed on a pair of X-cut surfaces thereof, respectively, in a pair of X-cut surfaces; oscillating the etalon by applying a dither signal to the axially supported portion of the etalon; sending the laser-beam into Z-cut surfaces of the etalon and passing the laser-beam between the reflecting film layers; receiving the laser-beam transmitted through the etalon, and converting the received laser-beam into an electrical signal; generating an error signal by comparing the electrical signal with the dither signal; and controlling a driving state of the semiconductor laser on the basis of the error signal, to approach the wavelength of the laser-beam to an extremal value of a light transmittance of the etalon.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE INVENTION

Embodiments of the present invention will be described in detail below with reference to the accompanying drawing.

First Embodiment

Figure 1:
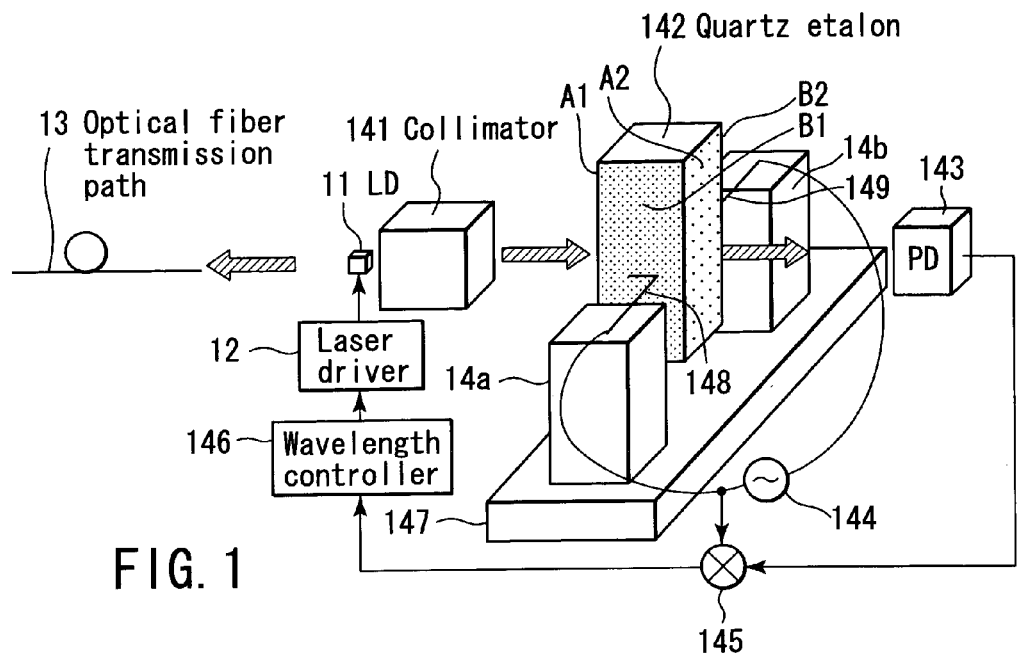
FIG. 1 is a perspective view schematically showing a wavelength stabilizing apparatus as the first embodiment according to the present invention.

FIG. 1 is a perspective view schematically showing a wavelength stabilizing apparatus as the first embodiment according to the present invention. In FIG. 1, reference numeral 11 denotes a semiconductor laser (LD). The semiconductor laser 11 oscillates by an injection current from a laser driver 12, and emits signal light having a predetermined wavelength forward and backward. The signal light emitted from the front of the semiconductor laser 11 is sent into an optical fiber transmission path 13 by an optical system (not shown). The signal emitted from the back of the semiconductor laser 11 enters a wavelength stabilizing apparatus 14 of this embodiment.

In the wavelength stabilizing apparatus 14, the signal light (to be referred to as laser-beam hereinafter) from the semiconductor laser 11 is converted into collimated light by a collimator 141 inserted on the optical axis. This collimated light is transmitted through a central portion of a quartz etalon 142, and sent into a photo-detector (PD) 143 where the collimated light is converted into an electrical signal.

The quartz etalon 142 is obtained by cutting a quartz bulk into the shape of a rectangular parallelepiped, forming light reflecting film layers A1 and A2 on a pair of Z-cut surfaces (perpendicular to the optical axis), and forming electrode layers B1 and B2 on a pair of X-cut surfaces (parallel to the optical axis). The electrode layers B1 and B2 are connected to an oscillator 144. The oscillator 144 generates a dither signal corresponding to the mechanical resonance frequency of the quartz etalon 142. Therefore, the quartz etalon 142 resonates at the mechanical resonance frequency by the dither signal applied between the electrode layers B1 and B2. The incoming laser-beam to the quartz etalon 142 is transmitted after being modulated by the cavity length variation of the quartz etalon 142.

The photo-detector 143 receives the laser-beam modulated by the quartz etalon 142, and generates an electrical signal corresponding to the change in light intensity. This electrical signal (to be referred to as a photo-detection signal hereinafter) is supplied to a synchronous detector 145 together with the output dither signal from the oscillator 144. The synchronous detector 145 performs synchronous detection for the photo-detection signal and dither signal, and generates a phase error signal. This phase error signal is supplied to a wavelength controller 146 of the semiconductor laser 11.

On the basis of the phase error signal, the wavelength controller 146 controls an injection current which drives the semiconductor laser 11, or controls the temperature by using a Peltier element or the like. Consequently, the wavelength of the light of the semiconductor laser 11 stabilizes at the extremal value of the light transmittance of the quartz etalon 142. If the semiconductor laser 11 is a wavelength-variable laser having a wavelength control electrode, a control signal based on the phase error signal is supplied to the wavelength control electrode.

The arrangement described above is the basic arrangement. The characteristic feature of the arrangement of the present invention is that the quartz etalon 142 is not directly fixed to a base 147, but is axially supported in central portions of the X-cut surfaces. More specifically, one end portion of each of shafts 148 and 149 made of conductive wires is connected to the center of a corresponding one of the X-cut surface electrode layers of the quartz etalon 142, such that the shafts 148 and 149 perpendicularly protrude from the X-cut surfaces. The shafts 148 and 149 are fixed to a pair of pillars 14a and 14b, respectively, formed on the base 147, so that the quartz etalon 142 is separated from the base 147 and the optical axis of the laser-beam is positioned in the center of the quartz etalon 142. The other end portions of the shafts 148 and 149 are connected to the oscillator 144. Therefore, the dither signal generated by the oscillator 144 is supplied to the electrode layers of the quartz etalon 142 via the shafts 148 and 149.

Figure 2:
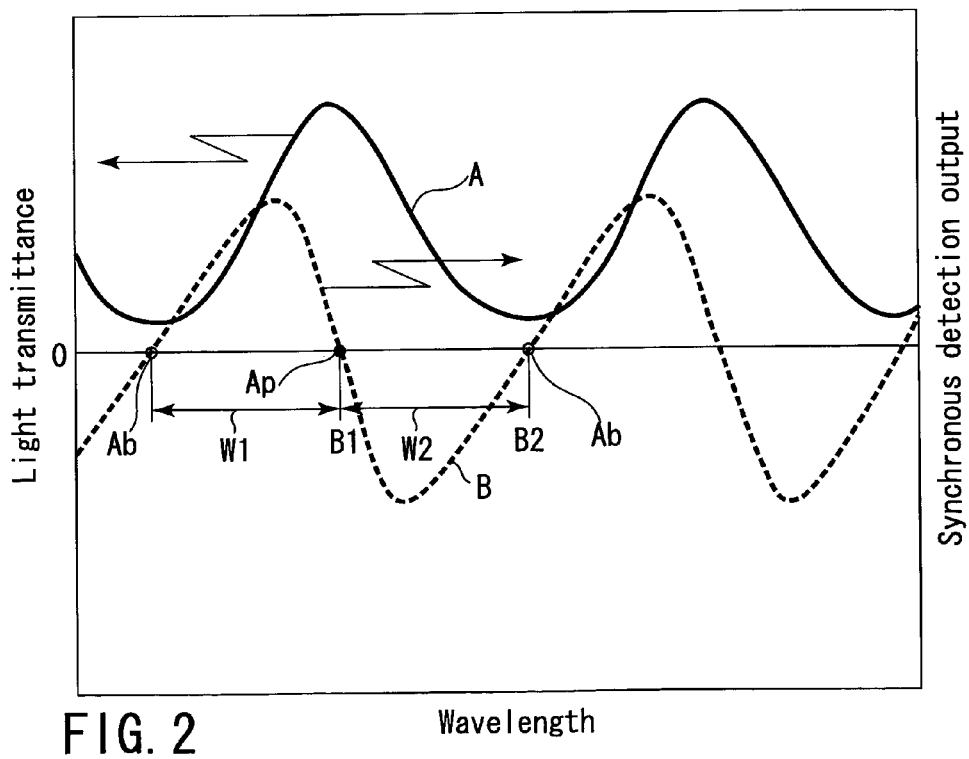
FIG. 2 is a graph showing the light transmittance and synchronous detection output characteristic of the apparatus shown in FIG. 1.

The operation of the wavelength stabilizing apparatus having the above arrangement will be described below with reference to FIG. 2. FIG. 2 is a graph showing the light transmittance and synchronous detection output characteristic of the apparatus shown in FIG. 1. Referring to FIG. 2, a waveform A shows the way the light transmittance of the quartz etalon 142 changes by the dither signal.

When the dither signal is applied to the electrode layers on the X-cut surfaces, the quartz etalon 142 expands and contracts by the piezoelectric effect. Accordingly, the light transmittance also moves from side to side, albeit subtly, by the dither signal. As a consequence, the intensity of the laser-beam transmitted through the quartz etalon 142 changes. The sign of the slope of the light transmittance in a wavelength region W1 from a minimum value Ab to a maximum value Ap of the light transmittance differs from that in a wavelength region W2 from the maximum value Ap to the minimum value Ab. Therefore, the intensity of the transmitted light modulated by the quartz etalon 142 has a phase difference of 180° between the wavelength regions W1 and W2.

Accordingly, synchronous detection is performed between a signal obtained by photo-electrically converting the transmitted light from the quartz etalon 142 and the dither signal, thereby obtaining a signal having a waveform B as an error signal. The error signal B is input to the wavelength controller 146 to control the injection current or temperature of the semiconductor laser 11, thereby making the oscillation wavelength of the semiconductor laser 11 approach zero-crossing points B1 and B2 of the error signal B. The wavelengths at B1 and B2 are the maximum value Ap and minimum value Ab, respectively, of the light transmittance of the quartz etalon 142. Therefore, by changing the polarity of feedback control, the wavelength of the laser-beam can be selectively stabilized at the wavelength which gives a maximum value or minimum value of the light transmittance of the quartz etalon 142. This method using the dither signal as described above can stabilize the wavelength with high accuracy, since the method is unaffected by a DC drift of an amplifier or a dark current change of a photo-detector.

The foregoing is the basic operation principle of the wavelength stabilizing apparatus using a dither signal, and is similar to that of the conventional apparatus. However, the arrangement of the above embodiment has an effect of greatly increasing the synchronous detection output compared to that of the conventional apparatus. The reason will be explained below.

The quartz etalon 142 is separated from the base 147, and the central portion of the quartz etalon 142 is axially supported by the shafts 148 and 149. In a mechanical resonance mode at the lowest mechanical oscillation frequency in this state, the central portion of the quartz etalon 142 is a node, and the two end portions of the quartz etalon 142 are antinodes. Since the shafts 148 and 149 are connected to the node, therefore, the mechanical loss caused by the connection of the shafts 148 and 149 is small, and the Q value significantly increases upon mechanical resonance. In an experiment, when the quartz etalon 142 is fixed to the base 147, the Q value of the quartz etalon 142 takes a number of several to several tens. In contrast, when the central portion of the quartz etalon 142 is axially supported, the Q value is several hundred to several thousand.

The modulation index of the quartz etalon transmitted light is a maximum in the node portion, i.e., in the central portion, and is 0 in the free end portions. Conventionally, the end portion of the quartz etalon is fixed to the base, so the node of the etalon is this end portion fixed to the base. Since it is difficult to pass laser-beam through this end portion, laser-beam is conventionally passed through a portion slightly above the end portion. A factor like this also decreases the modulation index of the transmitted light from the quartz etalon.

In contrast, in the arrangement of this embodiment, laser-beam can be transmitted through the central portion which is the node in which the optical modulation index is a maximum. Accordingly, the output from the synchronous detector 145 can be increased to be about 100 times as large as that in the conventional apparatus. This sharply increases the signal-to-noise ratio of the signal obtained from the photo-detector 143, and thereby greatly increases the wavelength accuracy.

Second Embodiment

When a quartz etalon is fixed to a base as in the conventional apparatus, a small Q value makes the formation of an oscillation circuit difficult. In the first embodiment, however, the Q value of the mechanical resonance of the quartz etalon 142 significantly increases. Therefore, the quartz etalon 142 can be incorporated as an transducer into an oscillation circuit.

Figure 3:
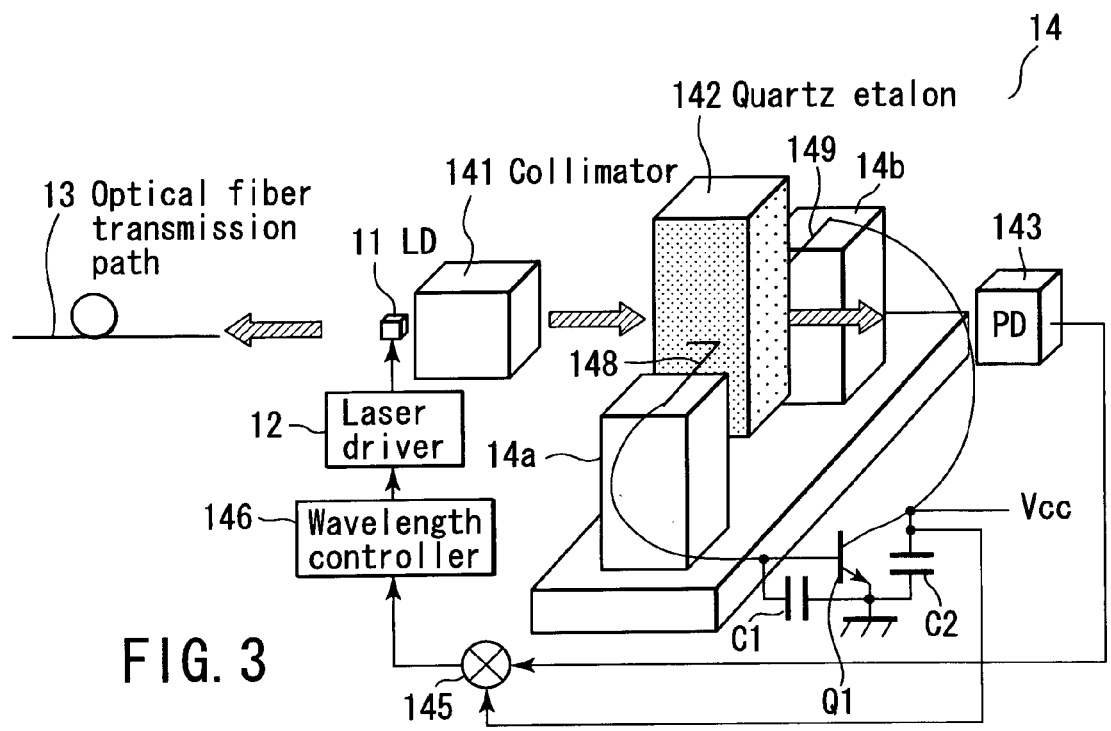
FIG. 3 is a perspective view schematically showing a wavelength stabilizing apparatus as the second embodiment according to the present invention.

FIG. 3 is a perspective view schematically showing a wavelength stabilizing apparatus as the second embodiment according to the present invention. The same reference numerals as in FIG. 1 denote the same parts in FIG. 3, and a repetitive explanation thereof will be omitted.

In this apparatus shown in FIG. 3, a transducer V1 which is a quartz etalon 142 is interposed between the base and collector of a transistor Q1, and capacitors C1 and C2 are connected in its base-to-emitter path and collector-to-emitter path, respectively, thereby forming a Colpitts oscillation circuit as a whole. An oscillation signal is naturally applied to the quartz etalon 142 as well.

In the oscillation circuit having the above arrangement, the oscillation frequency is higher by about 0.1% than the mechanical resonance frequency of the quartz etalon 142, i.e., this oscillation frequency can be regarded as substantially the same as the mechanical resonance frequency. In this embodiment, therefore, the frequency of a dither signal can be automatically matched with the mechanical resonance frequency of the quartz etalon 142 without any adjustment. Synchronous detection can be performed by extracting an oscillation output signal from the collector of the transistor Q1, and applying the extracted signal to a synchronous detector 145.

The above embodiment is explained by taking a Colpitts oscillation circuit as an example. However, the present invention can be similarly practiced by another type of oscillation circuit such as a Hartley oscillation circuit.

Third Embodiment

As the third embodiment of the present invention, a method of increasing the resistance against external vibration and shock will be described.

Figure 4:
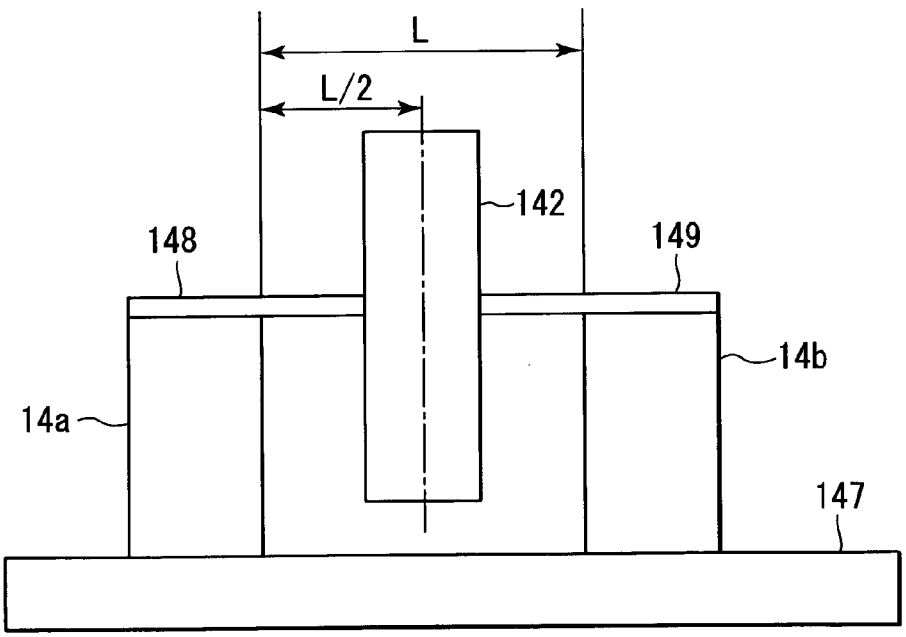
FIG. 4 is a perspective view schematically showing a wavelength stabilizing apparatus as the third embodiment according to the present invention.

FIG. 4 shows a structure when a portion in which a quartz etalon 142 is axially supported on a base 147 is viewed from the front with respect to the optical axis in a wavelength stabilizing apparatus 14 shown in FIG. 1 or 3. Referring to FIG. 4, the distance between pillars 14$a$ and 14$b$ is L cm, and the quartz etalon 142 is positioned in the center between the pillars 14$a$ and 14$b$. Letting F be the shafting resonance frequency when shafts 148 and 149 are regarded as elastic members and the quartz etalon 142 is regarded as a material particle having a weight of W kg, $$F = \frac{4}{\pi}\sqrt{\frac{3EIg}{WL^3}} \tag{1}$$

where E is a Young's modulus (kgf/cm$^2$), g is a gravitational acceleration of 980 cm/s$^2$, and I is the sectional secondary moment. If the shafts 148 and 149 are circular pillars and their diameter is d cm, $$I=\pi d^4/64 \tag{2}$$

Figure 5:
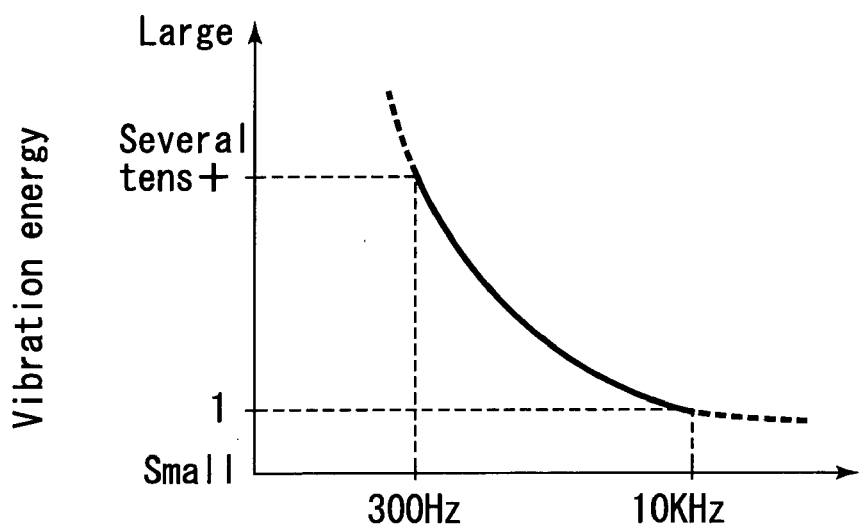
FIG. 5 is a graph showing the frequency characteristic of a floor impulsive sound (vibration energy) explained in the third embodiment.

As shown in FIG. 5, the frequency component of a floor impulsive sound (vibration energy) is inversely proportional to a frequency of 300 Hz or higher. That is, the energy of a high frequency component significantly decreases; the energy decreases to small fractions at 10 kHz or higher, when compared to a low-frequency region. Accordingly, if the shafting resonance frequency F is set at 10 kHz or higher, the influence of external vibrational shock can be well reduced. To this end, it is effective to decrease the pillar-to-pillar distance L when equation (1) is taken into consideration.

Figure 6:
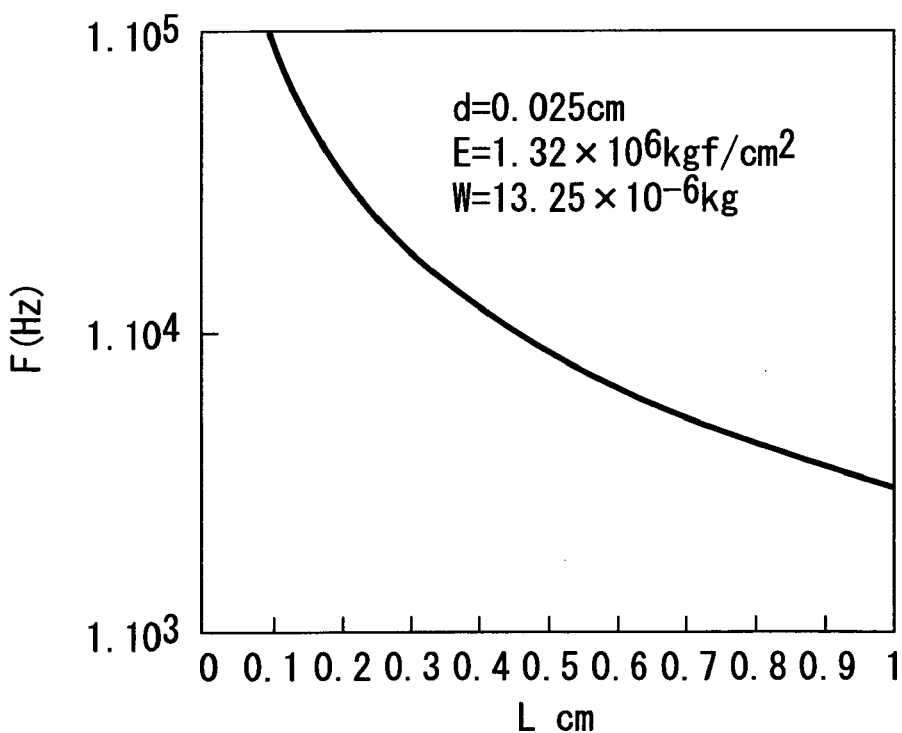
FIG. 6 is a graph showing the relationship between the pillar-to-pillar distance and the shafting resonance frequency in the apparatus shown in FIG. 4.

FIG. 6 is a graph showing a calculation example of the shafting resonance frequency F as a function of the distance L. Since the quartz etalon 142 has a width, the distance L cannot be made smaller than this width of the quartz etalon 142. However, when the distance L is set at 0.4 cm, the shafting resonance frequency F is 10 kHz or higher, i.e., a high enough shafting resonance frequency can be set.

Fourth Embodiment

As the fourth embodiment according to the present invention, a method of maximizing the wavelength detection sensitivity of the bottom of the light transmittance will be described in detail below.

As is well known, a light transmittance T of a Fabry-Perot resonator using a quartz etalon 142 is represented by $$T = \frac{(1-R)^2}{(1-R)^2 + 4R\sin^2(2\pi nL/\lambda)} \tag{3}$$

where R is the reflectance of light reflecting films B1 and B2, n is the refractive index of the quartz etalon 142, and L is the length of the quartz etalon 142 in the optical axis direction.

The characteristic of the light transmittance T is as indicated by a waveform A shown in FIG. 2. An output from a synchronous detector 145 is as indicated by a waveform B shown in FIG. 2. This is the form of first derivative dT/dL of equation (3). The slope of dT/dL represents the wavelength detection sensitivity. Normally, detection sensitivity |dT/dL| when the light transmittance takes an extremal value is smaller than that when the light transmittance takes a minimum value. Therefore, it is desirable to maximize the detection sensitivity |dT/dL| when the light transmittance takes a minimum value. Conditions for the purpose are obtained from d$^2$T/dL$^2$=0. Accordingly, equation (3) is rewritten to obtain a quadratic equation represented by $$R^2-6R+1=0 \tag{4}$$

When this quadratic equation is solved, the reflectance R is obtained as R=3-2√2=0.172. That is, when the reflectance is 17%, the wavelength detection sensitivity of the bottom of the light reflectance is a maximum. In practice, if the reflectance falls within the range of about 17±5%, the detection sensitivity does not significantly deteriorate.

Fifth Embodiment

Figure 7:
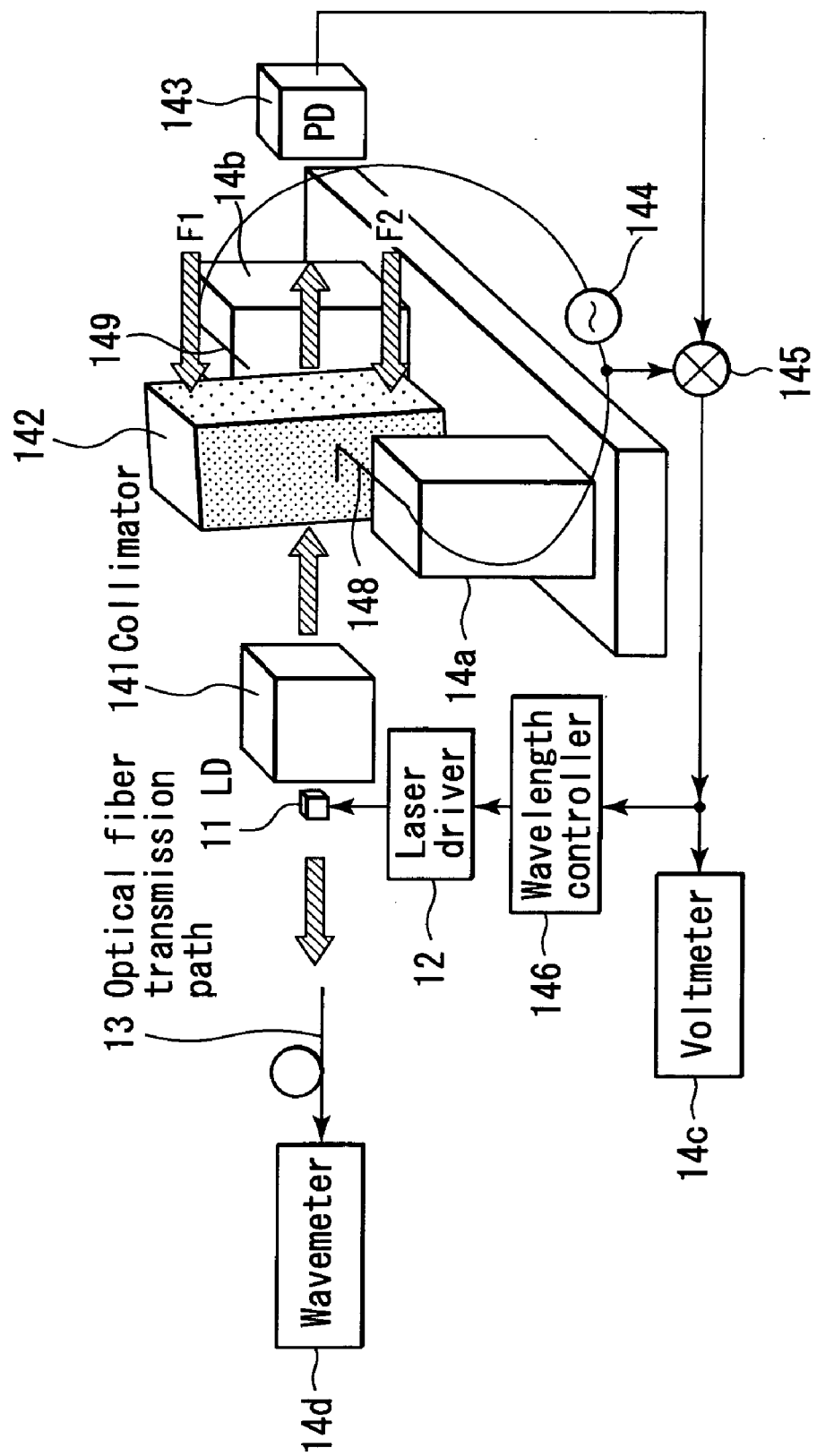
FIG. 7 is a perspective view schematically showing a wavelength stabilizing apparatus as the fifth embodiment according to the present invention.

FIG. 7 is a perspective view schematically showing a wavelength stabilizing apparatus as the fifth embodiment according to the present invention. The same reference numerals as in FIG. 1 denote the same parts in FIG. 7, and a repetitive explanation thereof will be omitted.

In this embodiment, an adjusting method will be explained by which a wavelength to be stabilized is matched with the extremal value of the light transmittance of a quartz etalon 142 by adjusting the elevation angle of the quartz etalon 142 with respect to the optical axis of laser-beam.

When the quartz etalon 142 is inclined a very small angle α from a plane perpendicular to the optical axis, a light transmittance T is represented by $$T = \frac{(1-R)^2}{(1-R)^2 + 4R\sin^2(2\pi nL\cos\alpha/\lambda)} \tag{5}$$

Therefore, the wavelength characteristic can be freely shifted by changing the angle α. In actual adjustment, as shown in FIG. 7, the elevation angle is preferably adjusted by applying forces F1 and F2 to the upper and lower portions of the quartz etalon 142. When plastic wires are used as shafts 148 and 149, the elevation angle can be easily corrected by applying a force to, e.g., the lower portion if an excess force is applied to the upper portion.

This method performs adjustment by causing a semiconductor laser 11 to emit light, applying a dither signal to the quartz etalon 142, measuring the output voltage from a synchronous detector 145 by a voltmeter 14c, and measuring the wavelength of transmitted light in an optical filter transmission path 13 by a wave meter 14d. In this adjusting method, the elevation angle need only be so adjusted that the synchronous detection output is 0 at the wavelength to be set. In this way, the adjusting method of this embodiment can exceptionally increase the wavelength accuracy with extremely simple adjustment.

As described above, the wavelength stabilizing apparatus of the above embodiment can sharply increase the signal-to-noise ratio of a signal obtained from the wavelength detection system, and greatly increase the accuracy of the wavelength to be stabilized. It is also possible to eliminate adjustment of the frequency of a dither signal, so the adjusting time can be shortened. Furthermore, angle adjustment for adjusting the wavelength characteristic of the quartz etalon 142 can be performed by operating the synchronous detection system after the etalon is fixed. Accordingly, the wavelength setting accuracy can be especially increased with a simple adjusting operation.

In each of the above embodiments, laser-beam emitted from the back of the semiconductor laser 11 is sent into the wavelength stabilizing apparatus 14. However, the front laser-beam has the same wavelength as that of the rear laser-beam. Therefore, the same effect can be obtained by branching the laser-beam emitted from the front and sending the branched light into the wavelength stabilizing apparatus 14.

Also, in each of the above embodiments, the shape of the quartz etalon 142 is a rectangular parallelepiped. However, the present invention is not limited to this shape. That is, the quartz etalon can take any shape as long as the etalon has reflecting film layers opposing each other. The point is that the effect of the present invention can be obtained by holding the central portion of the quartz etalon by a dither signal, and transmitting laser-beam through a portion which functions as a node of the mechanical resonance.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A wavelength stabilizing apparatus for stabilizing the wavelength of a laser-beam radiated from a semiconductor laser, comprising:
   an etalon which is obtained by cutting a quartz bulk, and includes a pair of light reflecting film layers formed on a pair of Z-cut surfaces of the etalon, respectively, and a pair of electrode layers formed on a pair of X-cut surfaces thereof, respectively;
   a dither signal generator which generates a dither signal corresponding to a mechanical resonance frequency of the etalon;
   a pair of shafts which are conductive, have a pair of end portions connected to the pair of X-cut surfaces of the etalon, respectively, to axially support the etalon, and are supplied with the dither signal;
   a supporting device which supports the pair of shafts;
   a photo-detector which receives the laser-beam transmitted through the etalon and converts the received laser-beam into an electrical signal;
   an error signal generator which generates an error signal by comparing the electrical signal with the dither signal; and
   a controller which controls a driving state of the semiconductor laser on the basis of the error signal to approach the wavelength of the laser beam to an extremal value of a light transmittance of the etalon.

2. An apparatus according to claim 1, wherein the dither signal generator includes an oscillation circuit having the etalon as a transducer and generating an oscillation signal as the dither signal.

3. An apparatus according to claim 1, wherein the pair of shafts are made of an elastic material, and a shafting resonance frequency of the etalon is set at not less than 10 kHz when the etalon axially supported by the shafts is regarded as a material particle.

4. An apparatus according to claim 1, wherein the controller controls an injection current to the semiconductor laser or a temperature of the semiconductor laser on the basis of the error signal.

5. An apparatus according to claim 1, wherein
a reflectance of the light reflecting film layer is 17±5%.

6. An apparatus according to claim 1, wherein
the controller controls the driving state of the semiconductor laser to selectively stabilize the wavelength at one of a maximum value of the light transmittance of the etalon and a minimum value thereof.

7. An apparatus according to claim 1, wherein
a reflectance of the light reflecting film layer is 17±5%, and
the controller controls the driving state of the semiconductor laser to selectively stabilize the wavelength at one of a maximum value of the light transmittance of the etalon and a minimum value thereof.

8. An apparatus according to claim 1, wherein the pair of shafts have plasticity and, when an angle of an axis of the etalon with respect to the optical axis of the laser-beam is adjusted around an axis of the axial support, the shafts holds the adjusted state.

9. An apparatus according to claim 1, wherein a light signal radiated from the semiconductor laser is transmitted through a central portion of the etalon.

10. An apparatus according to claim 1, wherein the one end portion of each of shafts is connected to the central potion of a corresponding one of the X-cut surface electrode layers of the quartz etalon.

11. A wavelength stabilizing method of stabilizing the wavelength of a laser-beam radiated from a semiconductor laser, comprising:
   axially supporting an etalon which is obtained by cutting a quartz bulk, and includes a pair of light reflecting film layers formed on a pair of Z-cut surfaces of the etalon, respectively, and a pair of electrode layers formed on a pair of X-cut surfaces thereof, respectively, in a pair of X-cut surfaces;
   oscillating the etalon by applying a dither signal to the axially supported portion of the etalon;
   sending the laser-beam into Z-cut surfaces of the etalon and passing the laser-beam between the reflecting film layers;
   receiving the laser-beam transmitted through the etalon, and converting the received laser-beam into an electrical signal;
   generating an error signal by comparing the electrical signal with the dither signal; and
   controlling a driving state of the semiconductor laser on the basis of the error signal, to approach the wavelength of the laser beam to an extremal value of a light transmittance of the etalon.

12. A method according to claim 11, wherein the dither signal is obtained by oscillating the etalon as a transducer.

13. A method according to claim 11, wherein when the etalon is regarded as a material particle, and a shafting resonance frequency of the etalon is not less than 10 kHz.

14. A method according to claim 11, wherein the driving state is controlled an injection current to the semiconductor laser or a temperature of the semiconductor laser on the basis of the error signal.

15. A method according to claim 11, wherein a reflectance of the light reflecting film layer is set at 17±5%.

16. A method according to claim 11, wherein controlling the driving state of the semiconductor laser includes stabilizing selectively the wavelength at one of a maximum value of the light transmittance of the etalon and a minimum value thereof.

17. A method according to claim 11, wherein a reflectance of the light reflecting film layer is set at 17±5%, and controlling the driving state of the semiconductor laser includes stabilizing selectively the wavelength at one of a maximum value of the light transmittance of the etalon and a minimum value thereof.

18. A method according to claim 11, wherein the wavelength to be stabilized is adjusted by adjusting, around an axis of the axial support, the angle of an axis of the etalon with respect to the optical axis of the laser-beam.

19. A method according to claim 18, wherein the etalon is held in a state in which the angle of an axis is adjusted.

* * * * *